United States Patent
Tanaka et al.

(10) Patent No.: US 11,909,233 B2
(45) Date of Patent: Feb. 20, 2024

(54) DISCONNECTION DETECTION DEVICE AND DISCONNECTION DETECTION METHOD

(71) Applicant: DENSO TEN Limited, Kobe (JP)

(72) Inventors: Shigeyuki Tanaka, Kobe (JP); Toyoshige Nakamura, Kobe (JP)

(73) Assignee: DENSO TEN Limited, Kobe (JP)

( * ) Notice: Subject to any disclaimer, the term of this patent is extended or adjusted under 35 U.S.C. 154(b) by 458 days.

(21) Appl. No.: 17/276,269

(22) PCT Filed: Nov. 6, 2019

(86) PCT No.: PCT/JP2019/043544
§ 371 (c)(1),
(2) Date: Mar. 15, 2021

(87) PCT Pub. No.: WO2020/261596
PCT Pub. Date: Dec. 30, 2020

(65) Prior Publication Data
US 2022/0037893 A1 Feb. 3, 2022

(30) Foreign Application Priority Data
Jun. 28, 2019 (JP) .................. 2019-121628

(51) Int. Cl.
*H02J 7/00* (2006.01)
*G01R 31/54* (2020.01)
(Continued)

(52) U.S. Cl.
CPC ............ *H02J 7/0016* (2013.01); *G01R 31/54* (2020.01); *H01M 10/425* (2013.01);
(Continued)

(58) Field of Classification Search
CPC ........ H02J 7/0016; H02J 7/345; G01R 31/54; H01M 10/425; H01M 10/441; H01M 10/482
(Continued)

(56) References Cited

U.S. PATENT DOCUMENTS 6,803,766 B2 * 10/2004 Kobayashi .............. B60L 58/22
324/434

FOREIGN PATENT DOCUMENTS

| CN | 106602649 A | 4/2017 |
| JP | 2010-025925 A | 2/2010 |

(Continued)

OTHER PUBLICATIONS

Jan. 7, 2020 International Search Report issued in International Patent Application No. PCT/JP2019/043544.

*Primary Examiner* — Nathaniel R Pelton
(74) *Attorney, Agent, or Firm* — Oliff PLC (57) ABSTRACT

A disconnection detection device includes CR filters, discharge circuits, and a detection unit. The CR filters are provided for respective battery cells of a battery pack in which the battery cells are connected in series. Each of the discharge circuits is connected between the battery cell and the CR filter and discharging the battery cell when cell voltages of the battery cells are made balanced. The detection unit successively discharges two of the battery cells connected in series, successively detects voltages of detection lines detecting contact voltages of the two battery cells after a predetermined time has passed from finish of discharge of each of the battery cells, and detects disconnection of each of the detection lines on the basis of a difference between the two detected voltages.

6 Claims, 6 Drawing Sheets

(51) Int. Cl.
  *H01M 10/42* (2006.01)
  *H01M 10/44* (2006.01)
  *H01M 10/48* (2006.01)
  *H02J 7/34* (2006.01)

(52) U.S. Cl.
  CPC ....... *H01M 10/441* (2013.01); *H01M 10/482* (2013.01); *H02J 7/345* (2013.01)

(58) Field of Classification Search
  USPC .......................................................... 320/118
  See application file for complete search history.

(56) References Cited

FOREIGN PATENT DOCUMENTS

| | | | |
|---|---|---|---|
| JP | 2017-158269 A | | 9/2017 |
| JP | 2017158269 | * | 9/2017 |
| JP | 2017-183092 A | | 10/2017 |
| JP | 2019-028038 A | | 2/2019 |
| WO | 2018/230187 A1 | | 12/2018 |

* cited by examiner

DISCONNECTION DETECTION DEVICE AND DISCONNECTION DETECTION METHOD

FIELD

An embodiment of the disclosure relates to a disconnection detection device and a disconnection detection method.

BACKGROUND

A battery pack in which a plurality of battery cells are connected in series may break down when any of the battery cells is overcharged. For this reason, when the charge amount is determined on the basis of the battery cell having the highest voltage, the battery cell having low voltage may fall into an insufficiently charged state, when the battery cells include a battery cell having low voltage. For this reason, there are devices monitoring the cell voltage of each of the battery cells of the battery pack, equalizing the voltage difference between the batteries, and balancing the cell voltages.

However, when a voltage detection line for a battery cell is disconnected, the device balancing the cell voltages cannot monitor the cell voltage, and consequently cannot balance the cell voltages. For this reason, there is a device monitoring the voltage of the voltage detection line and determining that the voltage detection line has been disconnected when the voltage of the voltage detection line decreases to a predetermined threshold or less (for example, see Patent Literature 1).

CITATION LIST

Patent Literature

Patent Literature 1: Japanese Patent Application Laid-open No. 2010-025925

SUMMARY

Technical Problem

However, in conventional art, when the cell voltage of a battery cell greatly decreases, there are cases where the device erroneously determines that the voltage detection line has been disconnected, even though disconnection of the voltage detection line has not occurred.

An aspect of the embodiment has been made in consideration of the problem described above, and an object thereof is to provide a disconnection detection device and a disconnection detection method enabling detection of disconnection of voltage detection lines connected with respective battery cells of a battery pack without erroneous determination.

Solution to Problem

A disconnection detection device according to one aspect of embodiments includes: CR filters provided for respective battery cells of a battery pack in which the battery cells are connected in series; discharge circuits each connected between the battery cell and the CR filter and discharging the battery cell when cell voltages of the battery cells are made balanced; and a detection unit successively discharging two of the battery cells connected in series, successively detecting voltages of detection lines detecting contact voltages of the two battery cells after a predetermined time has passed from finish of discharge of each of the battery cells, and detecting disconnection of each of the detection lines based on a difference between the two detected voltages.

Advantageous Effects of Invention

The disconnection detection device and the disconnection detection method according to an aspect of the embodiment enable detection of disconnection of voltage detection lines connected with respective battery cells of a battery pack without erroneous determination.

DESCRIPTION OF EMBODIMENTS

Figure 1:
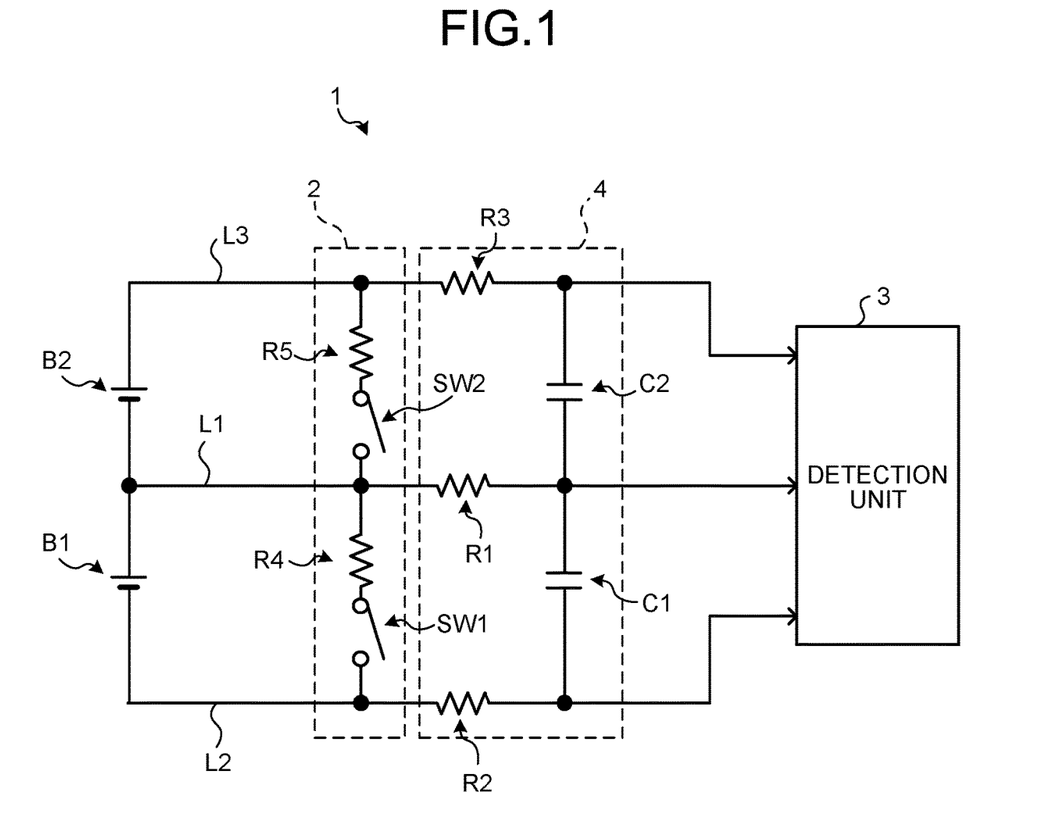
FIG. 1 is an explanatory drawing illustrating a circuit configuration example of a disconnection detection device according to an embodiment.

The following is a detailed explanation of an embodiment of a disconnection detection device and a disconnection detection method with reference to the attached drawings. The present invention is not limited to the embodiment described hereinafter. FIG. 1 is an explanatory drawing illustrating a circuit configuration example of a disconnection detection device according to the embodiment.

As illustrated in FIG. 1, a disconnection detection device 1 according to the embodiment includes a balancing circuit 2, a detection unit 3, and a filter circuit 4. The balancing circuit 2 equalizes cell voltages of battery cells B1 and B2 of a battery pack in which the battery cells B1 and B2 are connected in series.

The balancing circuit 2 includes discharge circuits provided for the respective battery cells B1 and B2 of the battery pack. The battery cells B1 and B2 are connected with the filter circuit 4 serving as a CR filter. Specifically, the battery cell B1 (hereinafter referred to as "first cell B1") is connected with a CR filter formed of a first resistor R1 and a first capacitor C1.

The first resistor R1 is connected in series between a positive electrode of the first cell B1 and the detection unit 3. The first capacitor C1 is connected at one terminal with a connection line connecting the first resistor R1 with the detection unit 3, and connected at the other terminal with a negative electrode of the first cell B1 via a second resistor R2 and with the detection unit 3.

The battery cell B2 (hereinafter referred to as "second cell B2") is connected with a CR filter formed of a third resistor R3 and a second capacitor C2. The third resistor R3 is connected in series between a positive electrode of the second cell B2 and the detection unit 3. The second capacitor C2 is connected at one terminal with a connection line connecting the third resistor R3 with the detection unit 3, and connected at the other terminal with the connection line connecting the first resistor R1 with the detection unit 3.

The balancing circuit 2 includes the discharge circuits discharging the first cell B1 and the second cell B2 individually when the cell voltages of the first cell B1 and the second cell B2 are made balanced. Specifically, the discharge circuit for the first cell B1 is provided between the first cell B1 and the CR filter for the first cell B1, and has a structure in which a fourth resistor R4 and a first switch SW1 connected in series are connected in parallel with the first cell B1.

The discharge circuit for the second cell B2 is provided between the second cell B2 and the CR filter for the second cell B2, and has a structure in which a fifth resistor R5 and a second switch SW2 connected in series are connected in parallel with the second cell B2.

The detection unit 3 detects voltages of a first voltage detection line L1 connected with the positive electrode of the first cell B1, a second voltage detection line L2 connected with the negative electrode of the first cell B1, and a third voltage detection line L3 connected with the positive electrode of the second cell B2 to monitor the cell voltages of the first cell B1 and the second cell B2.

For example, when the voltage of the first cell B1 is higher than the voltage of the second cell B2 by a predetermined voltage or more, the detection unit 3 balances the cell voltages by turning on the first switch SW1 from an OFF state and discharging the first cell B1.

In addition, for example, when the voltage of the second cell B2 is higher than the voltage of the first cell B1 by a predetermined voltage or more, the detection unit 3 balances the cell voltages by turning on the second switch SW2 from an OFF state and discharging the second cell B2.

The detection unit 3 as described above cannot monitor the cell voltages when any of the first voltage detection line L1, the second voltage detection line L2, and the third voltage detection line L3 is disconnected. For this reason, for example, the detection unit 3 regularly determines whether any of the first voltage detection line L1, the second voltage detection line L2, and the third voltage detection line L3 is disconnected.

Figure 2:
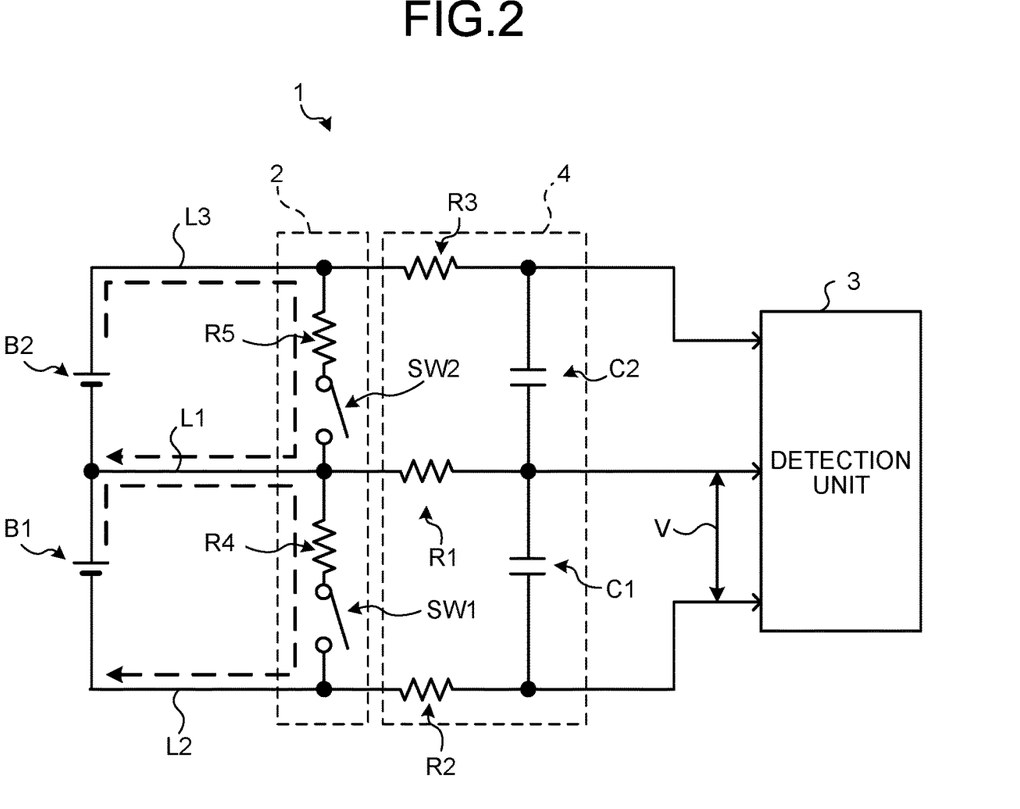
FIG. 2 is an operation explanatory drawing of the disconnection detection device in a non-disconnection state according to a comparative example of the embodiment.
Figure 3:
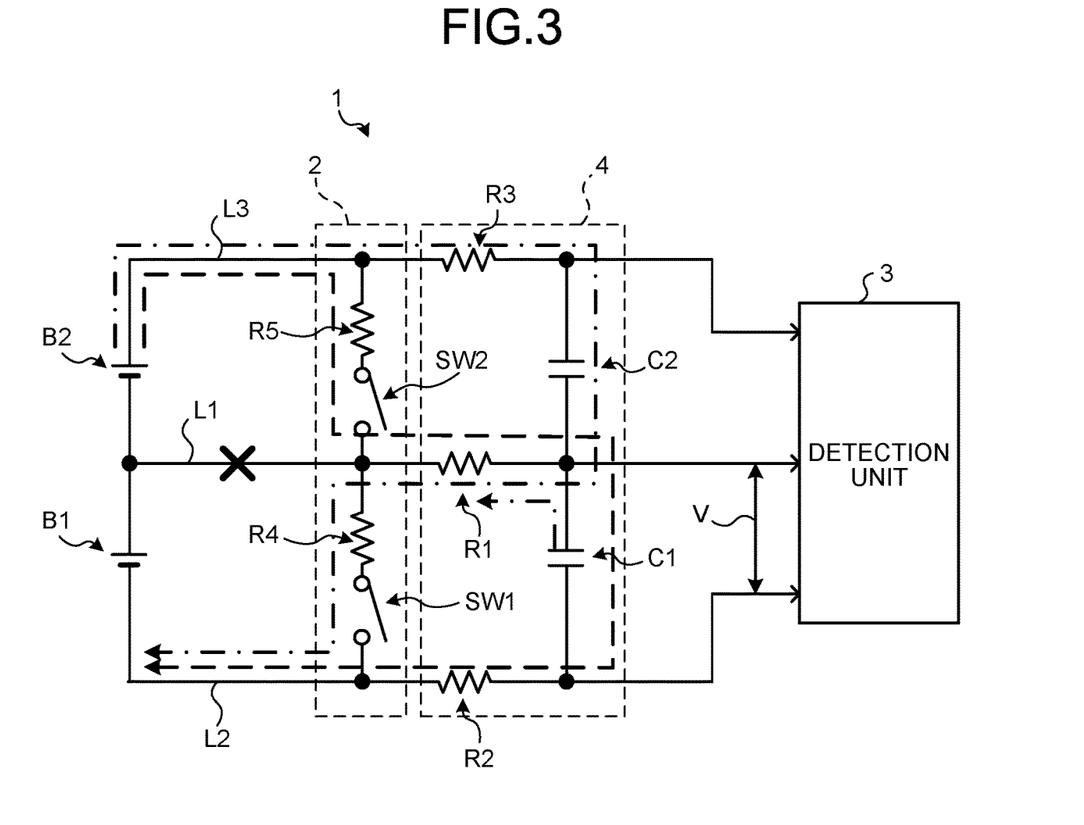
FIG. 3 is an operation explanatory drawing of the disconnection detection device in a disconnection state according to the comparative example of the embodiment.
Figure 4:
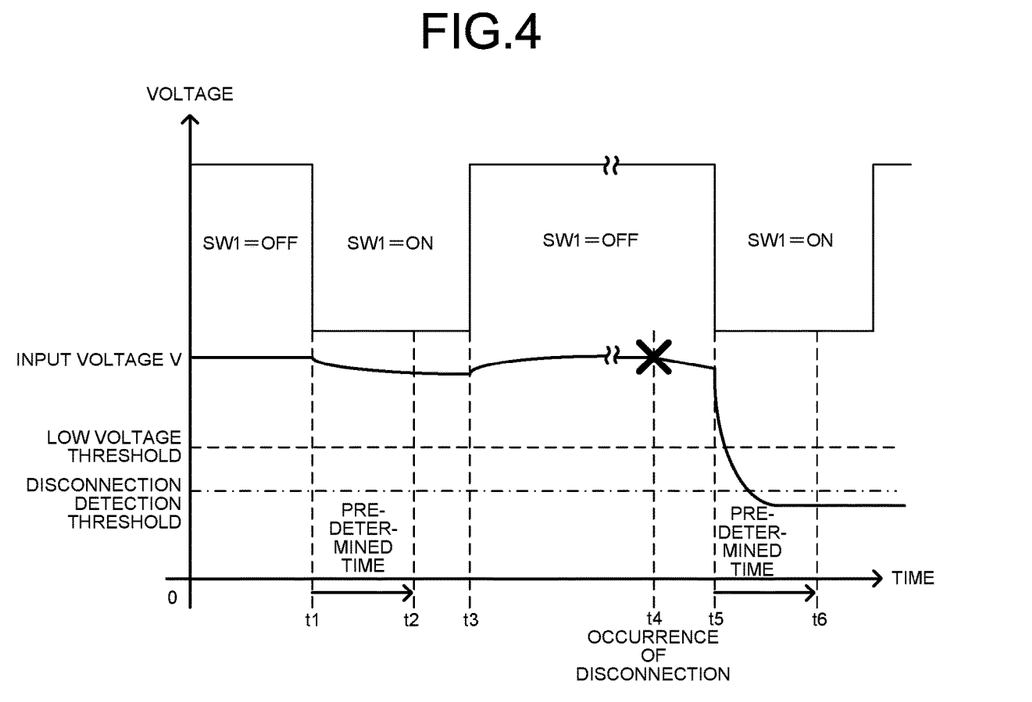
FIG. 4 is an explanatory drawing illustrating transition of the input voltage in the non-disconnection state and in the disconnection state according to the comparative example of the embodiment.

The following is an explanation of operations of a disconnection detection device according to a comparative example of the embodiment and transition of the detection line voltage with reference to FIG. 2 to FIG. 4. FIG. 2 is an operation explanatory drawing of the disconnection detection device in a non-disconnection state according to the comparative example of the embodiment. FIG. 3 is an operation explanatory drawing of the disconnection detection device in a disconnection state according to the comparative example of the embodiment. FIG. 4 is an explanatory drawing illustrating transition of the input voltage in the non-disconnection state and in the disconnection state according to the comparative example of the embodiment.

An ordinary detection unit according to the comparative example turns on the first switch SW1 to discharge the first cell B1, for example, when the detection unit determines whether the first voltage detection line L1 is disconnected. In this state, when the first voltage detection line L1 is not disconnected, a path is formed as illustrated with a broken-line arrow in FIG. 2. In the path, a current flows from the positive electrode of the first cell B1 to the negative electrode of the first cell B1, via the first voltage detection line L1, the fourth resistor R4, the first switch SW1, and the second voltage detection line L2.

In this manner, as illustrated in FIG. 4, for example, when the first switch SW1 is turned on at time t1, the first cell B1 is discharged, and input voltage V decreases by the discharged amount. In this state, the path through which the current flows is mainly a harness and has small path resistance. For this reason, voltage decrease of the input voltage V is as small as several tens of millivolts.

For this reason, for example, the ordinary detection unit according to the comparative example determines that the first voltage detection line L1 is not disconnected, when the input voltage V is not smaller than a disconnection detection threshold at time t2 at which a predetermined time has passed after the first switch SW1 was turned on at the time t1. Thereafter, the detection unit turns off the first switch SW1 at time t3.

By contrast, when the first voltage detection line L1 is disconnected, as illustrated with a dashed-line arrow in FIG. 3, the current flows from the positive electrode of the second cell B2 to the negative electrode of the first cell B1, via the third resistor R3, the second capacitor C2, the first resistor R1, the fourth resistor R4, and the first switch SW1. In this state, another path is also formed. In the path, the current flows from the first capacitor C1 to the negative electrode of the first cell B1, via the first resistor R1, the fourth resistor R4, and the first switch SW1.

In this manner, as illustrated in FIG. 4, for example, in the case where the first voltage detection line L1 is disconnected at time t4, when the detection unit turns on the first switch SW1 at time t5, the input voltage V greatly decreases because the voltage is discharged from the first capacitor C1 to the negative electrode of the first cell B1.

For this reason, the ordinary detection unit according to the comparative example determines that the first voltage detection line L1 is disconnected, when the input voltage V is smaller than the disconnection detection threshold at time t6 at which a predetermined time has passed after the first switch SW1 was turned on at time t5.

However, in the case where the disconnection detection threshold is not sufficiently lower than the cell low voltage (overdischarge) threshold, the ordinary detection unit according to the comparative example may erroneously determine that the first voltage detection line L1 is disconnected, when the cell voltage decreases to a value around the lower limit value, even when the first voltage detection line L1 is not disconnected.

Specifically, because the discharge circuit for cell balancing does not directly discharge the first capacitor C1 of the CR filter, the input voltage V during discharge depends on divided voltages of the first capacitor C1 and the second capacitor C2. For this reason, under the conditions with high cell voltages, there is the possibility that the input voltage V does not become 1 V or less even during discharge.

In addition, the threshold of the cell low voltage depends on the specifications of the cells, and is generally around 1 V to 2 V in a lithium-ion battery. For this reason, when the low voltage detection threshold is close to the disconnection detection threshold, the detection unit may erroneously determine a voltage decrease in discharge as disconnection even when no disconnection occurs, around the lower limit value of the cell voltages.

Besides, because the ordinary detection unit according to the comparative example uses the input voltage V itself as a determination value for disconnection diagnosis, erroneous determination of disconnection cannot be prevented, unless the value of the disconnection detection threshold serving as the determination criterion is also changed in accordance with change of the cell voltage. However, when the disconnection detection threshold is set to 1 V or more on assumption of the upper limit of the cell voltage, the disconnection detection threshold cannot be set sufficiently lower than the low voltage detection threshold.

For this reason, a disconnection detection method required is a method capable of accurately detecting disconnection without erroneous determination in the whole range of fluctuations of the cell voltage. For this reason, the present embodiment provides a disconnection detection method that is not influenced by the value of the cell voltage, in which disconnection of the first voltage detection line L1 is detected using a phenomenon that the input voltage V does not return to the voltage before discharge after the discharge is finished even when the first cell B1 and the second cell B2 are discharged in a disconnection state.

The detection unit 3 alternately and successively discharges the first cell B1 and the second cell B2 that are adjacent vertically, with the disconnection diagnosis part interposed therebetween, and acquires input voltages V1 and V2 corresponding to contact voltages of the first cell B1 and the second cell B2 after a lapse of a predetermined time from the finish of each discharge. In this operation, when the first voltage detection line L1 is conductive, each of the input voltages V1 and V2 has returned approximately to the cell voltage before discharge, and the absolute value |V1−V2| of a difference between input voltage V1 and input voltage V2 converges to a value around from several millivolts to several hundreds of millivolts.

By contrast, when the first voltage detection line L1 is disconnected (not conductive), even after a predetermined time has passed from the finish of discharge, the input voltages V1 and V2 are maintained approximately at the voltages at the time when discharge is finished, and the value |V1−V2| is at least equal to or larger than the voltage for one cell. For this reason, the detection unit 3 determines that the first voltage detection line L1 is disconnected, when the value |V1−V2| exceeds the disconnection detection threshold.

However, the disconnection detection threshold is set to a value larger than a fluctuation width of the voltage acquired by adding a margin to a designed value of the cell voltage before discharge to which the cell voltage is expected to return after discharge is finished, and smaller than the maximum fluctuation width of the cell voltage that can fluctuate in a battery cell, when the first voltage detection line L1 is not disconnected.

The following is an explanation of the operations of the disconnection detection device in the non-disconnection state and the disconnection state according to the present embodiment and transition of the input voltage in the non-disconnection state and the disconnection state according to the embodiment, with reference to FIG. 2, FIG. 3, FIG. 5, and FIG. 6.

Figure 5:
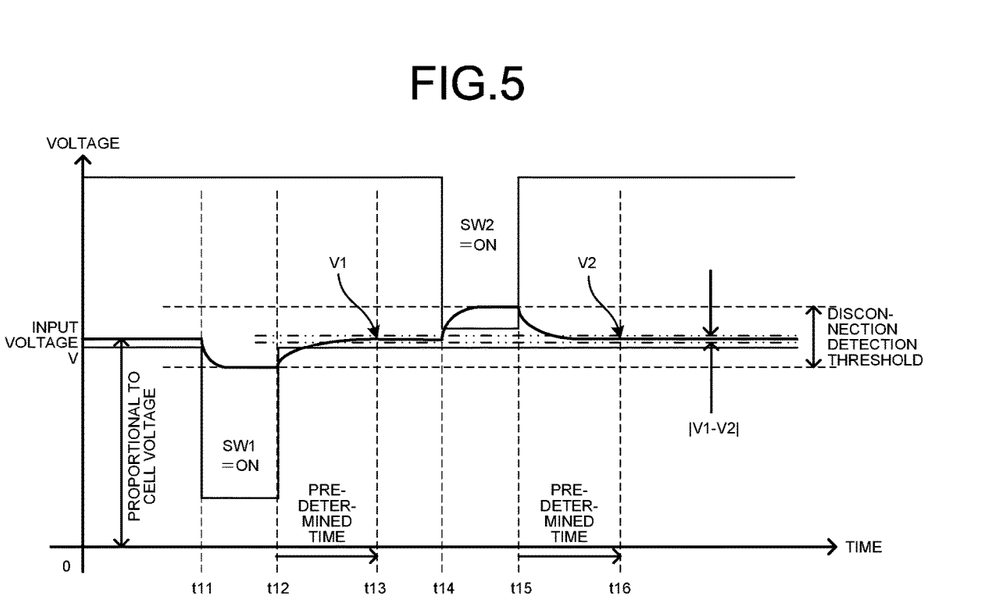
FIG. 5 is an explanatory drawing illustrating transition of the input voltage in a non-disconnection state according to the embodiment.
Figure 6:
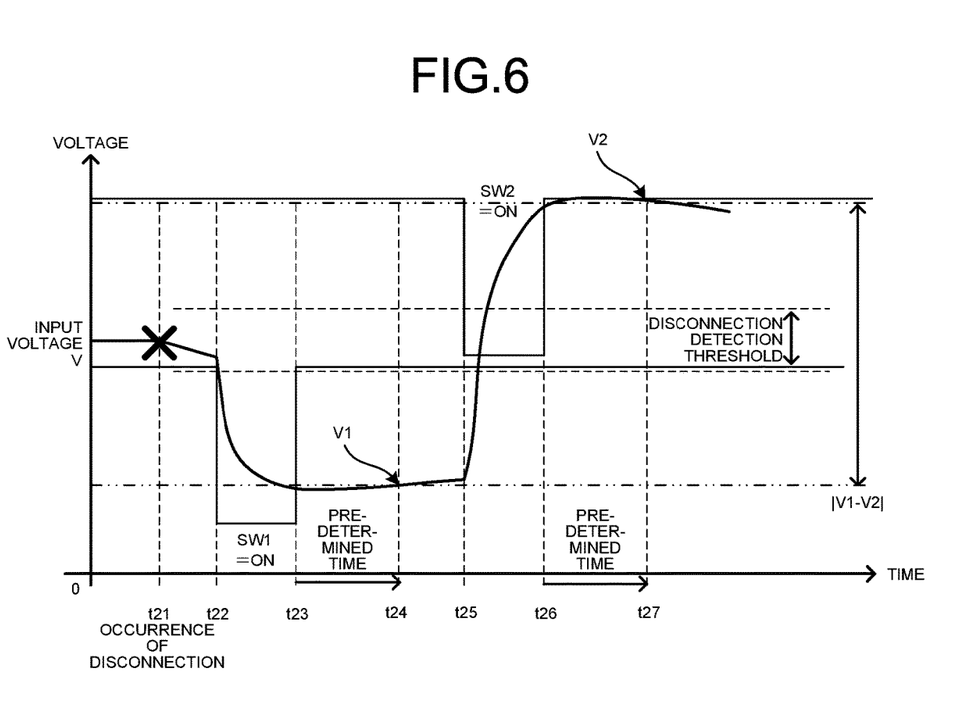
FIG. 6 is an explanatory drawing illustrating transition of the input voltage in a disconnection state according to the embodiment.

FIG. 5 is an explanatory drawing illustrating transition of the input voltage in the non-disconnection state according to the embodiment. FIG. 6 is an explanatory drawing illustrating transition of the input voltage in the disconnection state according to the embodiment.

When the detection unit 3 determines whether the first voltage detection line L1 is disconnected, first, the detection unit 3 turns on the first switch SW1, and thereafter turns off the first switch SW1. Thereafter, the detection unit 3 detects the input voltage V at the time after a predetermined time has passed, as the input voltage V1.

In this state, when the first voltage detection line L1 is not disconnected, the current flows from the positive electrode of the first cell B1 to the negative electrode of the first cell B1, via the first voltage detection line L1, the fourth resistor R4, the first switch SW1, and the second voltage detection line L2, as illustrated with the broken-line arrow in FIG. 2.

In addition, the detection unit 3 turns on the second switch SW2, and thereafter turns off the second switch SW2. Thereafter, the detection unit 3 detects the input voltage V at the time after a predetermined time has passed, as the input voltage V2. In this state, when the first voltage detection line L1 is not disconnected, the current flows from the positive electrode of the second cell B2 to the negative electrode of the second cell B2, via the third voltage detection line L3, the fifth resistor R5, the second switch SW2, and the first voltage detection line L1, as illustrated with the broken-line arrow in FIG. 2.

When such a series of operations are executed, the input voltage V transitions as illustrated with a bold solid line in FIG. 5, when the first voltage detection line L1 is not disconnected. Specifically, as illustrated in FIG. 5, the input voltage V is a voltage proportional to the cell voltage of the first cell B1, before the first switch SW1 is turned on.

Thereafter, the input voltage V slightly decreases by discharge of the first cell B1, when the first switch SW1 is turned on at time t11. The input voltage V increases when the first switch SW1 is turned off at time t12, unless the first voltage detection line L1 is disconnected.

In addition, at time t13 after a predetermined time has passed from the time t12 at which discharge of the first cell B1 is finished, the input voltage V increases approximately to the cell voltage of the first cell B1 before discharge. The detection unit 3 detects the input voltage V at time t13 as the input voltage V1.

Thereafter, the input voltage V increases slightly by discharge of the second cell B2 when the second switch SW2 is turned on at time t14. The input voltage V decreases when the second switch SW2 is turned off at time t15, unless the first voltage detection line L1 is disconnected.

At time t16 after a predetermined time has passed from the time t15 at which discharge of the second cell B2 is finished, the input voltage V decreases approximately to the cell voltage of the first cell B1 before discharge. The detection unit 3 detects the input voltage V at the time t16 as the input voltage V2.

As described above, when the first voltage detection line L1 is not disconnected, the input voltage V returns to approximately the same voltage as the cell voltage of the first cell B1 before discharge, after a predetermined time has passed from the finish of discharge of the first cell B1 and after a predetermined time has passed from the finish of discharge of the second cell B2.

For this reason, the detection unit 3 determines that the first voltage detection line L1 is not disconnected, when the absolute value |V1−V2| of the difference between the input voltage V1 and the input voltage V2 described above is equal to or smaller than the disconnection detection threshold.

By contrast, in the case where the first voltage detection line L1 is disconnected, when the first switch SW1 is turned on, the current flows through the path illustrated with the dashed-line arrow in FIG. 3. Specifically, the current flows from the positive electrode of the second cell B2 to the negative electrode of the first cell B1, via the third voltage detection line L3, the second capacitor C2, the first resistor R1, the fourth resistor R4, the first switch SW1, and the second voltage detection line L2.

Thereafter, after the first switch SW1 is turned off, when the second switch SW2 is turned on, the current flows through the path illustrated with the broken-line arrow in FIG. 3. Specifically, the current flows from the positive electrode of the second cell B2 to the negative electrode of the first cell B1, via the third voltage detection line L3, the fifth resistor R5, the second switch SW2, the first resistor R1, the first capacitor C1, the second resistor R2, and the second voltage detection line L2.

In this case, the input voltage V transitions as illustrated with a bold solid line in FIG. 6. Specifically, as illustrated in FIG. 6, for example, when the first voltage detection line L1 is disconnected at time t21, the input voltage V starts to gradually decrease from the time t21, because no voltage is applied from the first cell B1 to the first capacitor C1. Thereafter, when the first switch SW1 is turned on at time t22, the input voltage V greatly decreases, because the first capacitor C1 discharges.

Thereafter, the input voltage V is maintained approximately at the voltage at the time when discharge is finished, even when the first switch SW1 is turned off at t23, because the first voltage detection line L1 is disconnected and no voltage is applied from the first cell B1 to the first capacitor C1. For this reason, the detection unit 3 detects the input voltage V at time t24 at which a predetermined time has passed from the time t23 at which the first switch SW1 is turned off and discharge is finished, as the input voltage V1.

Thereafter, when the second switch SW2 is turned on at time t25, the input voltage V greatly increases, because the voltage is applied from the second cell B2 to the first capacitor C1. Thereafter, the input voltage V is maintained approximately at the voltage at the time when discharge is finished, even when the second switch SW2 is turned off at time t26, because the first voltage detection line L1 is disconnected and the first capacitor C1 is in a floating state.

For this reason, the detection unit 3 detects the input voltage V at time t27 at which a predetermined time has passed from the time t26 at which the second switch SW2 is turned off and discharge is finished, as the input voltage V2. As described above, when the first voltage detection line L1 is disconnected, the absolute value of the difference between the input voltage V1 after the predetermined time has passed from the finish of the discharge operation of the first cell B1 and the input voltage V2 after the predetermined time has passed from the finish of the discharge operation of the second cell B2 is at least larger than the fluctuation width of the cell voltage for one cell.

For this reason, the detection unit 3 determines that the first voltage detection line L1 is disconnected, when the absolute value |V1−V2| of the difference between the input voltage V1 and the input voltage V2 as described above exceeds the disconnection detection threshold.

In the case where such disconnection determination is executed, the values of the input voltages V1 and V2 fluctuate in accordance with the charged states (cell voltages) of the first cell B1 and the second cell B2, and the absolute value |V1−V2| exceeds the disconnection detection threshold when the first voltage detection line L1 is disconnected, regardless of the values of the input voltages V1 and V2. This structure enables the detection unit 3 to accurately determine disconnection without erroneous determination in the whole range of fluctuations of the cell voltage.

The method for determining disconnection of the first voltage detection line L1 has been described above, but the detection unit 3 is also capable of accurately determining disconnection of the second voltage detection line L2 and the third voltage detection line L3 by the same method as the disconnection determination method according to the comparative example.

Specifically, in the case where the second voltage detection line L2 is disconnected, when the detection unit 3 turns on the first switch SW1, the difference in potential between both terminals of the first capacitor C1 becomes approximately 0 V. For this reason, when the voltages of both terminals of the first capacitor C1 are equalized, the detection unit 3 can accurately determine that the second voltage detection line L2 detecting the voltage of the negative electrode of the battery pack is disconnected.

In the same manner, in the case where the third voltage detection line L3 is disconnected, when the detection unit 3 turns on the second switch SW2, the difference in potential between both terminals of the second capacitor C2 becomes approximately 0 V. For this reason, when the voltages of both terminals of the second capacitor C2 are equalized, the detection unit 3 can accurately determine that the third voltage detection line L3 detecting the voltage of the positive electrode of the battery pack is disconnected.

In addition, the disconnection detection device 1 determines disconnection of the first voltage detection line L1, the second voltage detection line L2, and the third voltage detection line L3 using the existing balancing circuit 2. This structure enables determination of disconnection only by adding software for disconnection detection, without changing the hardware configuration.

Further effects and modifications can be easily derived by the skilled person. For this reason, broader aspects of the present invention are not limited to any specific details or representative embodiments expressed and described above. Accordingly, various changes are possible without departing from the spirit or the range of the concept of the general invention defined by the attached claims and equivalents thereof.

The invention claimed is:

1. A disconnection detection device comprising:
   CR filters provided for respective battery cells of a battery pack in which the battery cells are connected in series;
   discharge circuits each (i) connected between a battery cell of the battery cells and a CR filter of the CR filters and (ii) discharging the battery cell when cell voltages of the battery cells are made balanced; and
   a detection unit configured to:
   alternately and successively discharge two of the battery cells that are connected in series and are adjacent to each other;
   after a predetermined time has passed from finish of discharge of each of the battery cells, (i) detect a voltage of a first detection line, which detects the voltage at a point between a positive electrode of one of the adjacent battery cells and a negative electrode of another of the adjacent battery cells, and (ii) detect a voltage of a second detection line, which detects the voltage of a negative electrode of the one of the adjacent battery cells; and
   detect disconnection of the first detection line based on a difference between the two detected voltages.

2. The disconnection detection device according to claim 1, wherein the detection unit determines that the first detection line is disconnected when an absolute value of the difference between the two detected voltages exceeds a predetermined threshold.

3. The disconnection detection device according to claim 2, wherein the predetermined threshold is smaller than a maximum fluctuation width of the cell voltage fluctuatable in one of the battery cells.

4. The disconnection detection device according to claim 1, wherein
the detection unit is configured to determine, when voltages of both terminals of a capacitor in the corresponding CR filter are equal after discharging the battery cell having an electrode serving as a positive electrode of the battery pack, that a third detection line detecting a voltage of the positive electrode of the other of the adjacent battery cells is disconnected.

5. The disconnection detection device according to claim 1, wherein
the detection unit is configured to determine, when voltages of both terminals of a capacitor in the corresponding CR filter are equal after discharging the battery cell having an electrode serving as a negative electrode of the battery pack, that the second detection line detecting the voltage of the negative electrode of the one of the adjacent battery cells is disconnected.

6. A disconnection detection method comprising:
with discharge circuits each (i) connected between a battery cell of battery cells of a battery pack and a CR filter of CR filters provided for the respective battery cells and (ii) discharging the battery cell when cell voltages of the battery cells are made balanced, alternately and successively discharging two of the battery cells that are connected in series and are adjacent to each other;
after a predetermined time has passed from finish of discharge of each of the battery cells, (i) detecting a voltage of a first detection line, which detects the voltage at a point between a positive electrode of one of the adjacent battery cells and a negative electrode of another of the adjacent battery cells, and (ii) detecting a voltage of a second detection line, which detects the voltage of a negative electrode of the one of the adjacent battery cells; and
detecting disconnection of the first detection line based on a difference between the two detected voltages.

* * * * *